United States Patent [19]

Sepponen

[11] Patent Number: 5,111,145
[45] Date of Patent: May 5, 1992

[54] METHOD AND APPARATUS FOR STUDYING THE PROPERTIES OF A MATERIAL

[75] Inventor: Raimo E. Sepponen, Helsinki, Finland

[73] Assignee: Instrumentarium Corp., Finland

[21] Appl. No.: 663,076

[22] Filed: Feb. 28, 1991

Related U.S. Application Data

[63] Continuation of Ser. No. 372,046, Jun. 27, 1989, abandoned.

[30] Foreign Application Priority Data

Jul. 1, 1988 [FI] Finland ................. 883153

[51] Int. Cl.$^5$ .......................................... G01R 33/62
[52] U.S. Cl. ........................... 324/316; 324/311
[58] Field of Search ............ 324/316, 311, 310, 313, 324/317, 307, 318

[56] References Cited

U.S. PATENT DOCUMENTS

| | | | |
|---|---|---|---|
| 3,475,680 | 10/1969 | Anderson et al. | 324/312 |
| 3,501,691 | 3/1970 | Ernst | 324/314 |
| 3,873,909 | 3/1975 | Ernst | 324/312 |
| 4,034,191 | 7/1977 | Tomlinson et al. | 235/151.3 |
| 4,070,611 | 1/1978 | Ernst | 324/309 |
| 4,110,681 | 8/1978 | Hofer et al. | 324/313 |
| 4,280,096 | 7/1981 | Karthe et al. | 324/316 |
| 4,345,207 | 8/1982 | Bertrand et al. | 324/308 |
| 4,563,647 | 1/1986 | Young | 324/309 |
| 4,587,493 | 5/1986 | Sepponen | 324/319 |
| 4,644,281 | 2/1987 | Savelainen | 324/320 |
| 4,654,595 | 3/1987 | Sepponen | 324/309 |
| 4,668,904 | 5/1987 | Kupiaineu | 323/350 |
| 4,712,068 | 12/1987 | Savelainen | 324/318 |
| 4,719,425 | 1/1988 | Ettinger | 324/316 |
| 4,743,850 | 5/1988 | Sepponen | 324/309 |

FOREIGN PATENT DOCUMENTS

| | | | |
|---|---|---|---|
| 750354 | 7/1980 | U.S.S.R. | 324/316 |
| 918829 | 4/1982 | U.S.S.R. | 324/313 |

OTHER PUBLICATIONS

Sigmund E. Lasker et al., *Annals of the New York Academy of Sciences*, 1973, vol. 222, "Electron Spin Resonance and Nuclear Magnetic Resonance in Biology and Medicine and Magnetic Resonance in Biological Sys.", pp. 307-323; 672-676; 764-777; 926-934.

Arthur R. Lepley et al., Chemically Induced Magnetic Polarization, 1973, pp. 37-43; 89-97; 134-139; 191-197; 220-227; 270-283; 320-327; 378-384.

Chandrakumar et al., "Field-Frequency Locked X-- Band Overhauser Effect Spectrometer", *Rev. Scientific Instruments*, 52(4), Apr. 1981.

"NMR Proton Imaging", Medical College of Wisconsin, Dept. of Neurosurgery, Battocletti, CRC *Critical Review in Biomedical Engineering*, vol. II, pp. 313-358.

"Magnetic Resonance Imaging at 0.02 T: Design and Evaluation of Radio Frequency, etc.", *ACTA Polytechnica Scandinavica*, Savelainen, Instrumentarium Corp. 1988.

"Proton Electron Double Resonance Imaging: A New Method for Imaging Free Radicals", Lurie et al., Dept. of Bio-Medical Physics and Bio-Engineering, Univ. of Aberdeen, Proceedings SM. RM, 1987.

"Proton-Electron Double Magnetic Resonance Imaging of Free Radical Solutions"; Lurie et al., J. of Magnetic Resonance 76, 366-370, 1988.

(List continued on next page.)

Primary Examiner—Tom Noland
Assistant Examiner—Louis M. Arana
Attorney, Agent, or Firm—Andrus, Sceales, Starke & Sawall

[57] ABSTRACT

The invention relates to a method and apparatus for applying dynamic nuclear polarization and magnetic imaging to studying an object. As the saturation of an electron spin system required by dynamic nuclear polarization is proceeding, the intensity of a polarizing magnetic field over the object is different from that of a polarizing magnetic field lying over the object during the detection of an NMR signal. The apparatus is provided with means for changing the intensity of a polarizing magnetic field in a manner such that the difference between magnetic field intensities is achieved.

7 Claims, 3 Drawing Sheets

OTHER PUBLICATIONS

"Discrimination and Characterization of Biological Tissues with Magnetic Resonance", ACTA Polytechnica Scandinavica, Sepponen, Instrumentarium Corp. 1986.

"Radiofrequency Penetration and Absorption in the Human Body: Limitations to High-Field Whole-Body Nuclear Magnetic Resonance Imaging", Roschmann, Philips GmbH, 1987, Med. Phys. 14(6), Nov./Dec., 1987.

"Measurement and Application of Dynamic Nuclear Polarization", Potenza, School of Chemistrym Rutgers University, 1972 Advances in Molecular Relaxation Processes, 4 (1972), 229-354.

METHOD AND APPARATUS FOR STUDYING THE PROPERTIES OF A MATERIAL

The present application is a continuation application of U.S. patent application Ser. No. 07/372,046, filed Jun. 27, 1989, and now abandoned.

The present invention relates to mapping the local distribution of the physico-chemical properties of an object, such as a human body, trunk of a tree, contents of a food package or some section of an industrial process by utilizing magnetic imaging and dynamic nuclear polarization (so-called Overhauser phenomenon, DNP).

BACKGROUND OF THE INVENTION

Magnetic imaging (MRI) is a technique which utilizes the nuclear magnetic resonance phenomenon (NMR) for finding out the nuclear density of an object and the local distributions of the NMR characteristics associated with a nucleus or the physical and chemical properties effecting them. Such NMR characteristics include e.g.: longitudinal relaxation (characterized by longitudinal relaxation time T1), transverse relaxation (characterized by transverse relaxation time T2), relaxation in a spinning set of coordinates (characterized by relaxation time T1rho), chemical shift, internuclear coupling factors. NMR characteristics are affected by physical phenomena, e.g.: flow, diffusion, paramagnetic materials, ferromagnetic materials, viscosity and temperature.

Techniques and applications of magnetic resonance and magnetic imaging have been described in a number of references: Stark DD and Bradley WG: Magnetic resonance imaging, C. V. Mosby Comp., St. Louis 1988, Gadian DG: Nuclear magnetic resonance and its applications to living systems, Oxford Univ. Press, London 1982, Shaw D: Fourier transform NMR spectroscopy, Elsevier, Amsterdam 1984, Battocletti JH: NMR proton imaging, CRC Crit. Rev. Biomed. Eng. vol. 11, pp. 313–356, 1984, Mansfield P and Morris PG: NMR imaging in biomedicine, Adv. in magnetic resonance, Academic Press, New York 1982, Abragam A: The principles of nuclear magnetism, Clarendon press, Oxford 1961, Lasker SE and Milvy P (eds.): Electron spin resonance and nuclear magnetic resonance in biology and medicine and magnetic resonance in biological systems, Annals of New York Academy of Sciences vol. 222, New York Academy of Sciences 1973, Sepponen RE: Discrimination and characterization of biological tissues with magnetic resonance imaging: A study on methods for T1, T2, T1rho and chemical shift imaging, Acta polytechnica scandinavica EL-56, Helsinki 1986, Fukushima E and Roeder SB: Experimental pulse NMR, Addison Wesley, London 1981, Anderson WA et al: U.S. Pat. No. 3 475 680, Ernst RR: U.S. Pat. No. 3 501 691, Tomlinson BL et al: U.S. Pat. No. 4 034 191, Ernst RR: U.S. Pat. No. 3 873 909, Ernst RR: U.S. Pat. No. 4 070 611, Bertrand RD et al: U.S. Pat. No. 4 345 207, Young IR: U.S. Pat. No. 4 563 647, Hofer DC et al: U.S. Pat. No. 4 110 681, Savolainen MK: Magnetic resonance imaging at 0.02 T: Design and evaluation of radio frequency coils with wave winding, Acta polytechnical scandinavica Ph 158, Helsinki 1988, Sepponen RE: U.S. Pat. No. 4 743 850, Sepponen RE: U.S. Pat. No. 4 654 595, Savolainen MK: U.S. Pat. No. 4 712 068, Sepponen RE: U.S. Pat. No. 4 587 493, Savolainen MK: U.S. Pat. No. 4 644 281 and Kupiainen J: U.S. Pat. No. 4 668 904. Dynamic nuclear polarization has been described e.g. in the following references: Lepley AR and Closs GL: Chemically induced magnetic polarization, Wiley, New York 1973, Potenza J: Measurement and Applications of dynamic nuclear polarization, Adv. Mol. Relaxation Processes vol 4, Elsevier, Amsterdam 1972, pp. 229–354, Ettinger KV: U.S. Pat. No. 4 719 425.

DNP is a magnetic double resonance technique which thus requires two separate spin populations. Such spin populations include e.g. the spins of electrons and protons. In the double resonance technique, the distribution of one spin population on various energy levels is altered and the other spin population is under observation. As certain conditions are fulfilled, the resonance signal of the spin population under observation grows. The amplitude of the amplified signal may be several hundred times greater than an unamplified signal. The amplification factor can be positive or negative. The amplified signal is characteristically highly sensitive to the physico-chemical properties and reactions of the spin environment, so its applicability to the examination of the chemical properties of a material is obvious.

The cited reference Ettinger KV: U.S. Pat. No. 4 719 425 discloses as applications the mapping of the contents of paramagnetic ingredients and the mapping of the activity of cerebral nerve cells.

The references Lurie DJ, Bussel DM, Bell LH, Mallard JR: Proton Electron Double Resonance Imaging: A new method for imaging free radicals, Proc. S.M.R.M. Fifth Annual Meeting, 1987, New York, p. 24 and Lurie DJ, Bussel DM, Bell LH, Mallard JR: Proton-Electron Double Magnetic Resonance Imaging of free radical solutions, J. Magn. Reson., vol. 76, 1988, pp. 366–370 disclose as possible applications the mappings of free radical groups, nitroxide radicals and the degree of oxidation.

SUMMARY OF THE INVENTION

The invention relates to a method and apparatus for applying dynamic nuclear polarization and magnetic imaging to studying an object. As the saturation of an electron spin system required by dynamic nuclear polarization is proceeding, the intensity of a polarizing magnetic field over the object is different from that of a polarizing magnetic field lying over the object during the detection of an NMR signal. The apparatus is provided with means for changing the intensity of a polarizing magnetic field in a manner that said difference between magnetic field intensities is achieved.

DESCRIPTION OF THE DRAWINGS

The invention has been illustrated in the accompanying drawings in which.

DESCRIPTION OF THE ILLUSTRATED EMBODIMENT

Figure 1:
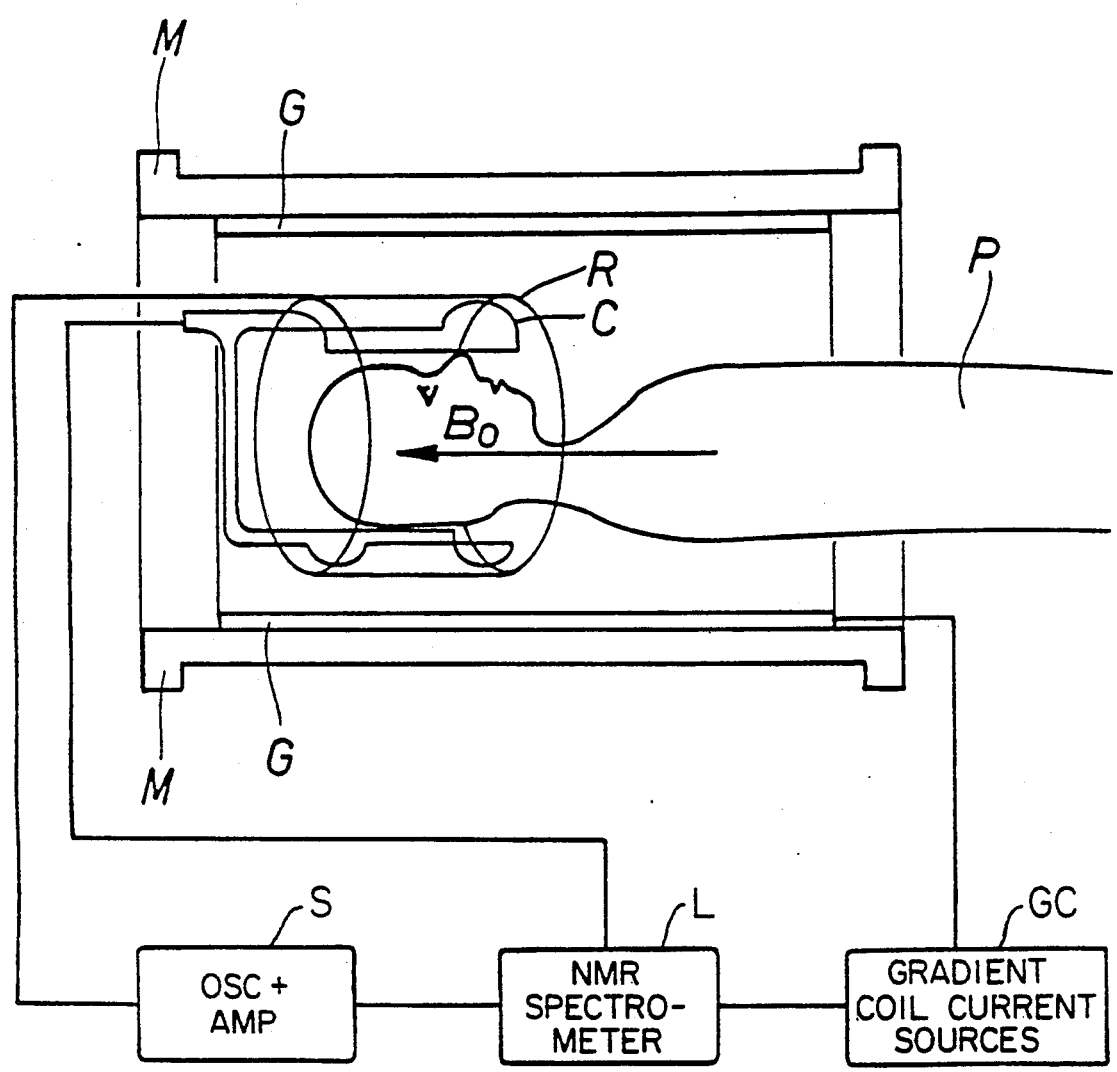
FIG. 1 shows schematically an apparatus according to the prior art.

According to the prior art, referring to FIG. 1, an object P to be examined is placed in as homogeneous a magnetic field $B_o$ as possible (so-called polarizing magnetic field). The apparatus further includes a signal coil C for detecting an NMR signal and connected to an NMR spectrometer L, a resonator assembly R for radiating the object with a magnetic field having the same frequency as the electron spin resonance (ESR), whereby to said assembly R is connected an oscillator and power amplifier unit S. The apparatus is provided with a gradient coil arrangement G for coding positional information, the power required thereby being produced by gradient current sources GC controlled by a spectrometer. The spectrometer L contains a computer and means for displaying and recording the images required by NMR and MRI operations. The spectrometer L also takes care of the operations control as required by alternative operations (e.g. imaging sequences and directions) selected by the operator.

According to the prior art, an electron spin system is saturated by radiating an object with a frequency which corresponds to ESR frequency in field $B_o$ and by detecting an NMR signal with a frequency which corresponds to field intensity $B_o$. Thus, for example, corresponding to the intensity 0.04T of $B_o$ used in the above-cited references Lurie et al are ESR frequency of 1.12 GHz and NMR frequency of 1.7 MHz.

A problem in the prior art is the absorption of the ESR frequency electromagnetic oscillation in an object being examined. This leads to two major drawbacks: 1. the saturation proceeding at ESR frequency occurs only in those sections of an object which are near the radiator (e.g. the penetration depth of 1.12 GHz in muscular tissue is less than 3 cm). 2. Since the width of an ESR line is relatively large, it is necessary to employ high capacities in saturation and these may damage an object (heating).

The interaction of electromagnetic radiation and biological tissue has been described e.g. in the following references: Michaelson SM: Human exposure to nonionizing radiant energy - Potential hazards and safety standards, Proc. IEEE, vol. 60, 1972, pp. 389–421, Czerski P: Experimental models for the evaluation of microwave biological effects, Proc. IEEE, vol. 63, 1975, pp. 1540–1544, Röschmann P: Radiofrequency penetration and absorption in the human body: Limitations to high field whole body nuclear magnetic resonance imaging, Med. Phys. 14(6), pp. 922–931, 1987, Tenforde TS and Budinger TF: Biological effects and physical safety aspects of NMR imaging and in vivo spectroscopy, in Thomas SR and Dixon RL (eds.) NMR in medicine: The Instrumentation and clinical applications, Medical Physics Monograph No. 14, American Institute of Physics, New York 1986.

The invention set forth in the annexed claims is capable of eliminating the prior art drawbacks for the application of DNP e.g. in whole body examinations.

Figure 2:
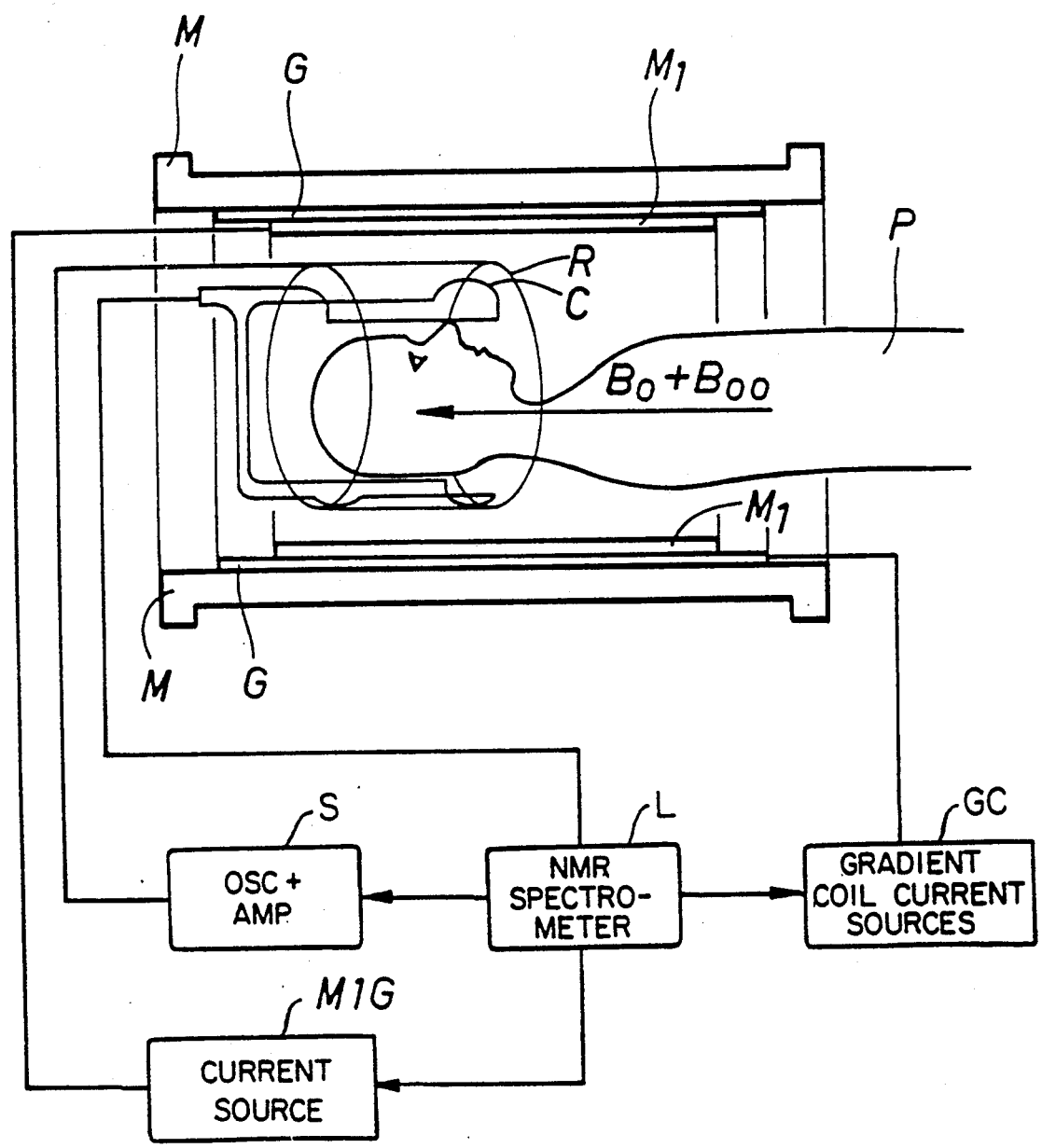
FIG. 2 shows an apparatus of the invention and FIG. 3 shows a time chart for the action of the invention.

Referring to FIG. 2, a method of the invention and an apparatus required thereby are as follows:

An object P is placed in as homogeneous magnetic field $B_o$ as possible generated by a magnet M, means $M_1$ and a controllable current source $M_1G$ for generating a magnetic field $B_{oo}$ over the object. The apparatus further includes a signal coil C for detecting an NMR signal and connected to an NMR spectrometer L a resonator assembly R for radiating an object with a magnetic field having the same frequency as the electron spin resonance (ESR), whereby to said assembly is connected an oscillator and power amplifier unit S, the apparatus further including a gradient coil arrangement G for coding positional information, the power required thereby being produced by gradient current sources GC controlled by spectrometer L.

Figure 3:
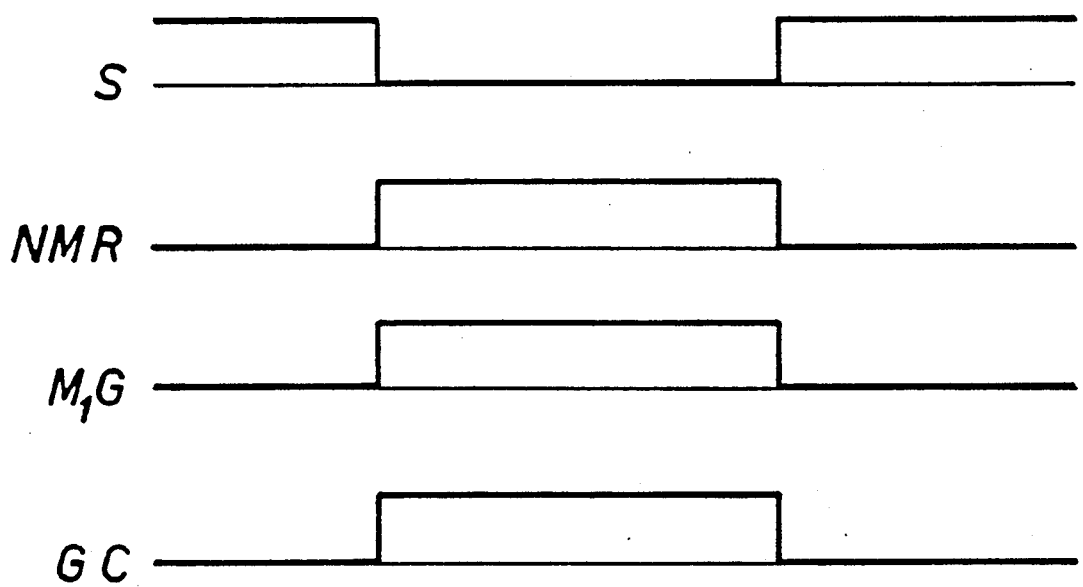

The electron spin system is saturated by radiating the object with a frequency which corresponds to ESR frequency in a polarizing field $B_o$ and by detecting the NMR signal with a frequency which corresponds to the polarizing field intensity $B_o+B_{oo}$. One action of the invention is illustrated schematically in FIG. 3. In FIG. 3, an axis S describes a saturating radiation sequence required for generating a DNP phenomenon, an axis NMR describes the timing for necessary NMR actions (NMR actions include the excitation pulses required for generating an NMR signal), an axis $M_1G$ describes timings of the invention for the changing operations of a polarizing magnetic field and an axis GC describes the timing for gradient operations required for imaging.

According to the invention, the electron spin saturation occurs in a field $B_o$ which can be e.g. 0.01 T, corresponding to ESR frequency of 260 MHz. This relatively low frequency does not absorb in the examined object, such as a human body, in a harmful degree and the intensification of nuclear magnetization occurs. In order to improve the signal-to-noise ratio in such a test, the NMR signal is detected e.g. in a 0.05 T field ($B_o=0.01T$ and $B_oo=0.04T$). Theoretically, the signal-to-noise ratio is thus 5 times better than in a prior art application in which the NMR detection would take place in the same field as the ESR saturation. In practice, the losses in an object lead to a somewhat lesser improvement in the signal-to-noise ratio. On the other hand, e.g. the dimensions of a human body are such that the practical embodiment of an optimal NMR signal coil requires a resonance frequency corresponding approximately to a 0.05 T field (circa 2.2 MHz). There are also cases in which the DNP induced boosting of an NMR signal diminishes as the field intensity increases. Similarly, the broadening of an ESR line induced by the paramagnetic ingredients of an object in higher field intensities leads to a weaker saturation. A higher polarizing field intensity also improves recording possibilities of the chemical shift of the nuclei of an object.

Simultaneously with ESR saturation, the object can be subjected also to electromagnetic radiations having other frequencies for narrowing the ESR line by saturating the spin systems of other nuclei having a magnetic moment.

In order to avoid unnecessary radiation of an object, the ESR radiation can be stopped during NMR detection.

Naturally, the intensity of a polarizing field during ESR saturation cannot exceed the field intensity during NMR detection. Thus, the field intensity correlation of the interactions of spin systems can be examined.

IN SUMMARY

1. In a method of the invention, the means of dynamic nuclear polarization and magnetic imaging are applied to studying an object in a manner that during the saturation of an electron spin system required by dynamic nuclear polarization the intensity of a polarizing magnetic field over the object is different from that of a polarizing magnetic field over the object during the detection of an NMR signal. Thus, it is possible to optimize the field intensities during ESR and NMR operations in view of the safety and physical aspects.

2. For narrowing the width of an ESR line it is possible to saturate the spin systems of the nuclei having a magnetic moment in the object by exposing the object to the resonance frequency electromagnetic radiations of the nuclei.

3. According to the invention, the electromagnetic radiation induced by electron spin saturation can be stopped during the detection of an NMR signal for lowering the power absorbed in an object.

4. In order to decrease the absorption of power, some electromagnetic radiations saturating the nuclear spin systems of an object can be stopped during the detection of an NMR signal.

I claim:

1. A method for the application of dynamic nuclear polarization and magnetic resonance imaging to studying an object, characterized in that, as the saturation of an electron spin system required by dynamic nuclear polarization is occurring, the intensity of a polarizing magnetic field over the object is different from that of a polarizing field lying over the target during the detection of an NMR signal.

2. A method as set forth in claim 1, characterized in that the spin systems of the nuclei having a magnetic moment in the object are saturated by exposing the object to the resonance frequency electromagnetic radiations of the nuclei.

3. A method as set forth in claim 1, characterized in that the electromagnetic radiation induced by electron spin saturation is stopped during the detection of an NMR signal.

4. A method as set forth in claim 1, characterized in that some electromagnetic radiations saturating the spin systems of an object are stopped during the detection of an NMR signal.

5. An apparatus for applying dynamic nuclear polarization and magnetic resonance imaging methods to studying an object, characterized in that said apparatus is provided with means for changing the intensity of a polarizing magnetic field in a manner that the intensity of a polarizing field over the object during the saturation of an electron spin system required by dynamic nuclear polarization is different from that of a polarizing field lying over the object during the detection of an NMR signal.

6. An apparatus as set forth in claim 5, characterized in that it is provided with means for saturating the spin systems of the nuclei having a magnetic moment in the object with resonance frequency electromagnetic radiations of the nuclei.

7. An apparatus as set forth in claim 5, said apparatus having means generating electromagnetic radiations for saturating electron and nuclear spin systems in the object, characterized in that it is provided with means for controlling said means generating the electromagnetic radiations which saturate the electron and nuclear spin systems, control being effected in a manner such that at least some of said generating means are switched off during the recording of an NMR signal.

* * * * *